July 18, 1967 J. H. McCUSKER 3,331,125

SEMICONDUCTOR DEVICE FABRICATION

Filed May 28, 1964

INVENTOR.
JOSEPH H. McCUSKER
BY
W.S. Hill
AGENT

United States Patent Office 3,331,125

SEMICONDUCTOR DEVICE FABRICATION

Joseph Henry McCusker, Princeton, N.J., assignor to Radio Corporation of America, a corporation of Delaware Filed May 28, 1964, Ser. No. 370,953
7 Claims. (Cl. 29—578)

Figure 1:
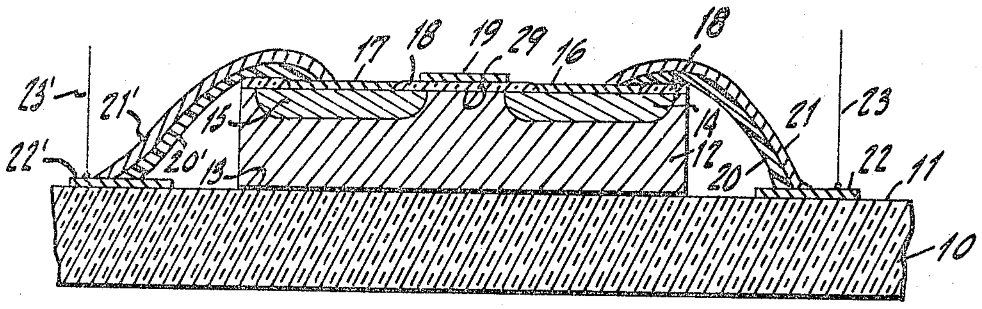

This invention relates to the fabrication of semiconductor devices, and more particularly to improved methods of fabricating electrical connections.

Arrays of closely spaced components including semiconductive devices and other circuit elements, such as resistors and capacitors, have achieved prominence as "integrated circuits." In one form of integrated circuit, a body of crystalline semiconductive material such as a chip or die is mounted on an insulating support, which may, for example, be a ceramic wafer. The semiconductive die is processed to form a plurality of semiconductor devices such as diodes and transistors. Passive circuit elements such as resistors and capacitors may also be formed in the die, or may be deposited on the insulating support, and then interconnected with the semiconductor devices formed in the die. In integrated circuits, as in semiconductor devices generally, it is often desired to fabricate electrical leads from the devices to the external environment. Since the semiconductive die utilized is both thin and small in area, it is difficult to attach a plurality of electrical leads directly to the semiconductive body. Instead, it is convenient to form electrical leads between the circuit elements and the support, which is larger and sturdier than the circuit elements. Electrical lead wires are then readily attached from the support to the external environment. However, it has hitherto been difficult to fabricate electrical leads between such circuit elements and their support. The present method is simpler, less time consuming, and less expensive than prior methods, especially for mass production. Moreover, the connection formed by the present method is mechanically stronger and more flexible than prior art methods.

It is an object of this invention to provide improved methods of fabricating improved circuit elements.

Another object is to provide improved methods of forming electrical connections between circuit elements on a support and said support.

Still another object is to provide a simple, rapid and inexpensive method of forming electrical connections between semiconductive circuit elements on a support and said support.

But another object is to provide a method of forming a mechanically strong electrical connection between a semiconductive circuit element on a support and said support.

Yet another object is to provide a method of forming a flexible electrical connection between a semiconductive circuit element on a support and said support.

These and other objects are attained according to the invention by connecting two spaced electrodes with a strip of synthetic resinous material, leaving the portion of said strip between said electrodes unsupported; and depositing an electrically conductive layer on said strip. The two electrodes may be on the same body, or each may be supported by one of two different bodies.

Figure 2:
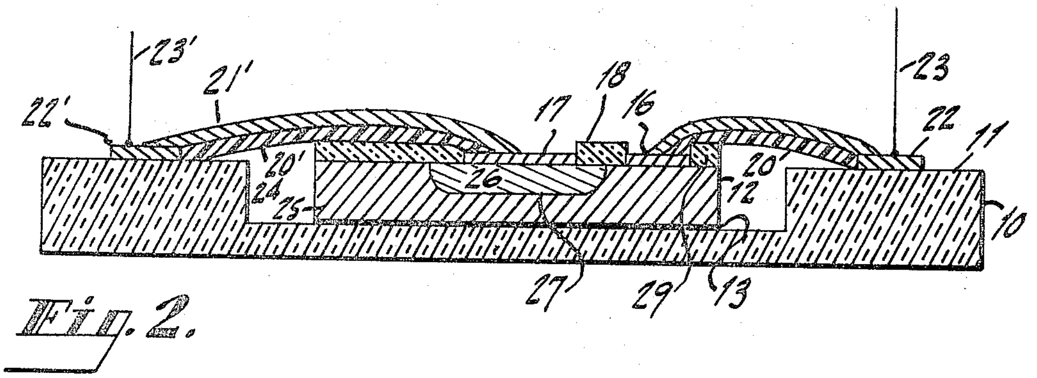

The invention and its features will be described in greater detail by the following examples, considered in conjunction with the accompanying drawing, in which:

FIGURE 1 is a cross-sectional view of a semiconductive body mounted on a support and having electrical connections between said wafer and said support; and, FIGURE 2 is a cross-sectional view of another embodiment of the invention.

Similar reference characters are applied to similar elements in the drawing.

EXAMPLE I

A support 10 (FIGURE 1) is prepared from an insulating material, which may, for example, be a soft glass, a hard glass such as Pyrex glass, fused quartz, a ceramic such as steatite, forsterite, and the like, Pyroceram, or a photosensitive lithium silicate, commercially available as Fotoceram. Pure alumina and the so-called high alumina ceramics which contain over 95% $Al_2O_3$ have also been found suitable for this purpose, and both of these are denominated hereafter "alumina" as a common or generic description. The exact size and shape of the insulating support 10 is not critical. In this example, support 10 is a square alumina wafer about 25 mils thick and 310 mils on edge.

A crystalline semiconductive body or die 12 is bonded by a solder layer 13 to one major face 11 of support 10. The semiconductive body 12 may consist of an elemental semiconductor such as germanium or silicon, or an alloy such as germanium-silicon alloy, or a compound such as gallium arsenide, indium phosphide and the like. In this example, body 12 consists of monocrystalline silicon. The exact size, shape and conductivity type of semiconductive body 12 are not critical. The semiconductive body 12 may contain a plurality of regions of different conductivity type, with p-n junctions between the regions. Alterntaively, the semiconductive body 12 may be of a single conductivity type, and may include a plurality of unipolar devices such as the insulated gate field-effect transistors described by S. R. Hofstein and F. P. Heiman in "Silicon Insulated-Gate Field-Effect Transistor," Proceedings IEEE, September 1963, pages 1190–1202. In general, the semiconductive body 12 may have on its upper face 29 a number of metallic electrodes. In this example, semiconductive body 12 is intrinsic, and includes two spaced heavily doped regions 14 and 15 of the same conductivity type adjacent the upper face 29 of body 12. Two metallic electrodes 16 and 17 on the upper face 29 of semiconductive body 12 are ohmic contacts to regions 14 and 15. The remaining portion of the exposed upper face 29 of body 12 is covered by an insulating film 18, which may for example be silicon oxide. The device includes a metallic control electrode 19 on the portion of insulating film 18 over the gap or space between semiconductor regions 14 and 15. The electrodes 16 and 17 may consist of aluminum, gold, nickel, chromium, and the like. In this example, electrodes 16 and 17 consist of gold.

A portion of a synthetic resin film is cut in the form of a strip 20. Alternatively, a quantity of an organic film-forming substance is converted to a solid strip 20. A wide variety of materials, generally referred to as liquid monomers, may be utilized for this purpose. Hundreds of such film-forming materials are commercially available, and are classified in groups such as vinyls, acrylics, cellulosics, fluorocarbons, polycarbonates, polypropylenes, polyethylenes, polyesters, styrenes, and the like. See, for example, Modern Plastics, encyclopedia edition for 1964, vol. 41, No. 1A, pages 476–501. Specific examples of materials suitable for this purpose are polyvinyl alcohol, polyvinyl chloride and nitrocellulose. The liquid monomer may be diluted with a volatile organic solvent, and used as an ink for drawing strips of the desired size and shape on a glass plate. The strips are then baked for 10 to 20 seconds at about 250° F., thus converting them to a solid synthetic resin, which is removed from the glass plate by tweezers. The solid or polymerized material is popularly known as a plastic.

The exact size and shape of strip 20 is not critical. Suitably, strip 20 is about 0.5 to 2.0 mils thick, about 1 to 20 mils wide, and about 50 to 300 mils long. The solid strip 20 is gently heated, and one end thereof pressed against one electrode 16, which adheres the strip to the electrode. Heating the strip 20 to a temperature of about 250° F. for about 15 to 30 seconds is sufficient for this purpose. The other end of strip 20 is similarly adhered to a metallic electrode 22 on face 11 of support 10. The electrode 22 may consist of a conductive strip or path formed by firing a metallic paint on the face 11 of the support 10. A similar plastic strip 20' is attached between the device electrode 17 and another metallic electrode 22' on face 11 of support 10. A metallic layer 21 preferably at least 0.2 mils thick is deposited by evaporation through a mask on the upper face of strip 20, and a similar metallic layer 21' is deposited on the upper face of strip 20'. One of the noble metals such as gold, palladium, and the like or alloys of these metals, may be utilized for this purpose. In this example, a very thin strike of chromium (not shown) is first deposited by vacuum evaporation through a mask on the plastic strips 20 and 20'. A layer of gold is then deposited by vacuum evaporation through a mask over the chromium strike on plastic strips 20 and 20'. The noble metal layer 21 forms a flexible but mechanically strong electrical connection between the device and electrode 22 on support 10. Metallic layer 21' forms a similar connection between device electrode 17 and electrode 22' on support 10. The metal layers 21 and 21' should be at least 0.2 mils thick to provide the necessary strength and flexibility. In this example, the layers 21 and 21' may be of gold and about 0.3 mils thick. If desired, the plastic strips 20 and 20' may now be removed by means of an organic solvent such as chloroform or carbon tetrachloride, without affecting the metallic connections between the semiconductive wafer 12 and the insulating support 10. If removal of the plastic strip 20, 20' is intended, the more soluble plastics should be utilized to form strips 20 and 20'. Alternatively, the plastic strips 20 and 20' may be left undisturbed in the completed unit, since they do not substantially affect the electrical characteristics of the device. A similar connection (not shown) may be made between one end of electrode 19 and a metallized strip on face 11 of support 10. Electrical lead wires such as 23 and 23' may be attached to the electrodes 22 and 22' respectively on face 11 of support 10. Alternatively, the electrodes 22 and 22' may be connected by metallized conductive paths to metallized notches on the edges of the support, as in micromodules. See for example U.S. Patent 2,971,138, issued February 7, 1961, to H. R. Meisel et al., and assigned to the assignee of this application.

EXAMPLE II

In this embodiment, an insulating support 10 is prepared with a well 24 (FIGURE 2) in one face 11 of the support. The support 10 may consist of any of the materials mentioned above. The well or slot 24 is made large enough to accommodate the semiconductive body utilized. A semiconductive body or die 12 is mounted in the well 20 by means of a solder layer 13. In this example, semiconductive body 12 consists of monocrystalline germanium, and has opposite conductivity type regions 25 and 26 adjacent the upper face 29 of body 12, with a p-n junction 27 between the said two regions. One metallic electrode 17 on the upper face 29 of semiconductive body 12 forms an ohmic electrical connection to the region bounded by p-n junction 27. Another metallic electrode 16 on the upper face 29 of body 12 forms an ohmic electrical connection to the remaining portion of body 12. Those portions of face 29 which are not occupied by electrodes 16 and 17 are covered by a layer 18 of an insulating material such as silicon oxide.

Plastic strips 20 and 20' are prepared as in the previous example. Strip 20 is attached at one end to the insulating film or layer 18 at a point immediately adjacent electrode 16. The other end of strip 20 is attached to face 11 of support 10 at a point immediately adjacent to electrode 22 on face 11 of support 10. Another plastic strip 20' is similarly attached between electrode 17 on the semiconductive body and electrode 22' on face 11 of the support 10. A conductive metallic layer 21 is deposited on plastic strip 20 and on portions of electrodes 16 and 22 immediately adjacent the strip 20. A similar conductive metal layer 21' is deposited on plastic strip 20' and the adjacent portions of electrodes 17 and 22'. The plastic strips 20 and 20' may next be removed by means of a solvent, or may be left in place. Electrical lead wires 23 and 23' may then be attached to the electrodes 22 and 22' respectively on face 11 of support 10, for example by means of a thermocompression bond.

An advantage of fabricating the electrical connections as described in the examples, is that the process may be performed at relatively low temperatures, of the order of 250° F. As a result of the low temperatures utilized, the semiconductive body is not injured nor is the distribution of conductivity charge carriers in the semiconductive body significantly altered.

Another advantage is that a large number of plastic strips maybe prepared at one time, and a plurality of connections may be simply, rapidly, and inexpensively fabricated. The method is thus suitable for mass production of integrated circuits.

The above examples are by way of illustration only, and not limitation. Instead of being a self-supporting die, the semiconductive body may be a thin layer deposited on the support by evaporation. The semiconductive body may include other types of devices, such as tunnel diodes, varactor diodes, pnpn diodes, triode transistors, and the like. Instead of connecting the semiconductor device to a metallic electrode on the support, the device maybe connected to a circuit element such as a resistor or a capacitor on the support. The plastic strips utilized, and the metallic layers deposited thereon, may be simple rectangular ribbons, or may be more complex shapes. Portions of the plastic strips may be removed, or "windows" may be cut in them, prior to the deposition of the metallic layers thereon. In each case, the metallic ribbon formed may correspond in size and shape to the plastic ribbon utilized. Alternatively, a plurality of narrow metallic ribbons may be deposited on a single wide plastic ribbon. Various other modifications may be made without departing from the spirit and scope of the invention as set forth in the specification and the appended claims.

What is claimed is:

1. The method of forming an electrical connection between two electrodes of electrical means in spaced proximate relationship to each other, comprising the steps of:
   - connecting said electrodes with a strip of synthetic resinous material, leaving the portion of said strip between said electrodes unsupported;
   - depositing an electrically conductive layer on said strip and into overlying contact with said electrodes; and,
   - removing said strip by dissolution in a solvent without disturbing said electrically conductive layer.

2. The method of forming an electrical connection between two electrodes of electrical means in spaced proximate relationship to each other, comprising the steps of:
   - connecting said electrodes with a strip of synthetic resinous material, leaving the portion of said strip between said electrodes unsupported;
   - depositing a metallic layer on said strip and into overlying contact with said electrodes; and,
   - removing said strip by dissolution in a solvent without disturbing said metallic layer.

3. The method of forming an electrical connection between two electrodes of electrical means in spaced proximate relationship to each other, comprising the steps of:
   - connecting said electrodes with a strip of synthetic resinous material, leaving the portion of said strip between said electrodes unsupported;
   - positioning a mask over said electrode and said strip;

vacuum evaporating a metallic layer through said mask onto said strip and into overlying contact with said electrodes; and removing said strip by dissolution in a solvent without disturbing said metallic layer.

4. The method of forming an electrical connection between two electrodes of electrical means in spaced proximate relationship to each other, comprising the steps of:

warming a strip of thermoplastic synthetic resinous material to a temperature sufficient to soften said strip;

attaching one end of said strip to a portion of one said electrode, and the other end of said strip to a portion of the other said electrode, leaving the portion of said strip between said electrodes unsupported;

positioning a mask over said electrodes and said strip; and, vacuum evaporating a metallic layer through said mask onto said strip and into overlaying contact with said electrodes.

5. The method of forming an electrical connection between two electrodes of electrical means in spaced proximate relationship to each other, comprising the steps of:

warming a strip of thermoplastic synthetic resinous material to a temperature sufficient to soften said strip;

attaching one end of said strip to a portion of one said electrode, and the other end of said strip to a portion of the other said electrode, leaving the portion of said strip between said electrodes unsupported;

positioning a mask over said electrodes and said strip;

vacuum evaporating a metallic layer through said mask over said strip and into overlaying contact with said electrodes; and, removing said strip by dissolution in a solvent without disturbing said metallic layer.

6. The method of forming an electrical connection between two electrodes of electrical means in spaced proximate relationship to each other, comprising the steps of:

warming a strip of thermoplastic synthetic resinous material to a temperature of about 250° F. to soften said strip;

attaching one end of said strip to a portion of one said electrode, and the other end of said strip to a portion of the other said electrode, leaving the portion of said strip between said electrodes unsupported;

positioning a mask over said electrodes and said strip;

vacuum evaporating a thin film of chromium through said mask on said chromium layer; and, with said electrodes;

vacuum evaporating a flexible layer of gold through said mark on said chromium layer; and, removing said strip by dissolution in a solvent without disturbing said flexible gold layer.

7. The method of forming an electrical connection between two electrodes of electrical means in spaced proximate relationship to each other on two supports, comprising the steps of:

warming a strip of thermoplastic synthetic resinous material to a temperature of about 250° F. for a period of time sufficient to soften said strip;

attaching one end of said strip to one said support immediately adjacent the one said electrode on said support;

attaching the other end of said strip to the other said support immediately adjacent the other said electrode, leaving the portion of said strip between said attached ends unsupported;

positioning a mask over said electrodes and said strip; and, vacuum evaporating a flexible metallic layer through said mask on said strip and on the portions of said electrodes immediately adjacent the ends of said strip.

References Cited

UNITED STATES PATENTS

| | | | |
|---|---|---|---|
| 2,876,530 | 3/1959 | Howatt | 29—155.5 |
| 2,972,092 | 2/1961 | Nelson. | |
| 2,981,877 | 4/1961 | Noyce. | |
| 3,090,706 | 5/1963 | Cado | 29—155.5 X |

WILLIAM I. BROOKS, *Primary Examiner.*

JOHN F. CAMPBELL, *Examiner.*